United States Patent
Rahmatian

(10) Patent No.: US 6,952,107 B2
(45) Date of Patent: Oct. 4, 2005

(54) OPTICAL ELECTRIC FIELD OR VOLTAGE SENSING SYSTEM

(75) Inventor: Farnoosh Rahmatian, Vancouver (CA)

(73) Assignee: NxtPhase Corporation, Vancouver (CA)

(*) Notice: Subject to any disclaimer, the term of this patent is extended or adjusted under 35 U.S.C. 154(b) by 122 days.

(21) Appl. No.: 10/294,083

(22) Filed: Nov. 13, 2002

(65) Prior Publication Data

US 2003/0117126 A1 Jun. 26, 2003

Related U.S. Application Data

(60) Provisional application No. 60/337,820, filed on Nov. 13, 2001.

(51) Int. Cl.[7] ............................................ G01R 31/308
(52) U.S. Cl. ........................................ 324/753; 324/96
(58) Field of Search ............................ 324/95, 96, 750, 324/752, 751, 244.1, 117 R, 753, 158.1; 385/12, 14, 15, 18; 250/227.17, 227.19, 227.21, 341.4, 310, 311; 356/351, 365; 359/245, 246, 247, 256, 257

(56) References Cited

U.S. PATENT DOCUMENTS

| | | |
|---|---|---|
| 4,374,359 A | 2/1983 | Missout |
| 4,814,930 A | 3/1989 | Abe et al. |
| 5,811,964 A | 9/1998 | Bosselmann et al. |
| 5,844,409 A | 12/1998 | Bosselmann |
| 5,847,560 A | 12/1998 | Bosselmann et al. |
| 5,892,357 A | 4/1999 | Woods et al. |
| 5,895,912 A | 4/1999 | Bosselmann |
| 5,933,000 A | 8/1999 | Bosselmann |
| 6,114,846 A | 9/2000 | Bosselmann |
| 6,122,415 A * | 9/2000 | Blake .......................... 385/12 |
| 6,208,129 B1 | 3/2001 | Willsch |
| 6,265,862 B1 | 7/2001 | Menke |
| 6,285,182 B1 * | 9/2001 | Blake et al. .................. 324/96 |
| 6,392,583 B1 | 5/2002 | Bosselmann |
| 6,417,660 B2 | 7/2002 | Menke |
| 2003/0117125 A1 | 6/2003 | Ramatian et al. |

OTHER PUBLICATIONS

Copy of: EP Search Report: Application No. EP 02 25 7844 (3 pages).

N.A.F. Jaeger & F. Rahmatian, "Integrated Electro–Optic High–Voltage Senors," EPRI–Optical Sensors for Utility T & D Applications Workshop, a workshop paper, Jul. 20–21, 1995, Portland, Oregon.

* cited by examiner

Primary Examiner—Kamand Cuneo
Assistant Examiner—Jimmy Nguyen
(74) Attorney, Agent, or Firm—Robert A. Pajak

(57) ABSTRACT

An electric field sensing system is characterized so that a signal processor may derive an output representative of an electric field intended to be measured, particularly established by high voltage on a power line, with enhanced accuracy. Characterizing parameters may be derived from signals representative of a pair of light waves derived from a light wave exiting an optical electric field sensing element in a electric field sensing head spatially positioned in the high voltage environment.

29 Claims, 10 Drawing Sheets

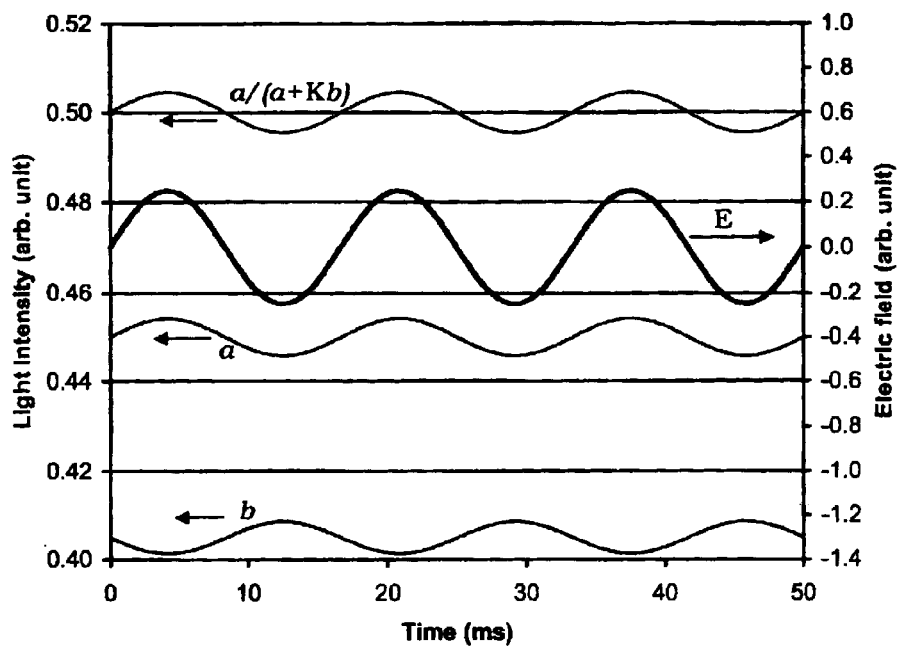
Figure 2. E, $a$, and $b$, and $S_A = [a/(a+Kb)]$, for a sinusoidal 60 Hz signal $E = E_o \sin(2\pi f\, t)$. In this example, $f = 60$ Hz, $K_A = 0.90$, $K_B = 0.81$, $P_o = 1$, $(\pi E_o / E_\pi) = 0.01$, $\alpha = 0.90$, $\Delta\varphi_o = 0$, and $K = K_A/K_B = 1.111$.

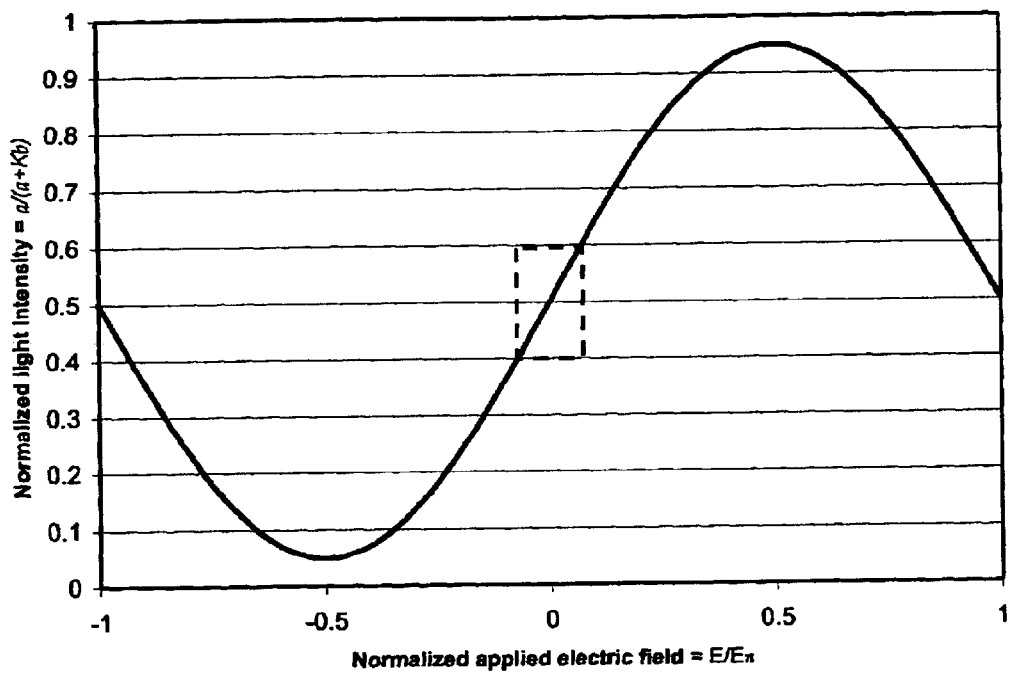
Figure 3. Normalized transfer function of a Pockels cell electric field sensor as per equation (4). In this example, $\alpha = 0.90$, $\Delta\varphi_o = 0$, $K_A = 0.90$, $K_B = 0.81$, and $K = K_A/K_B = 1.111$. The sensor is often used in the most linear portion of its transfer function, shown with a dashed rectangle.

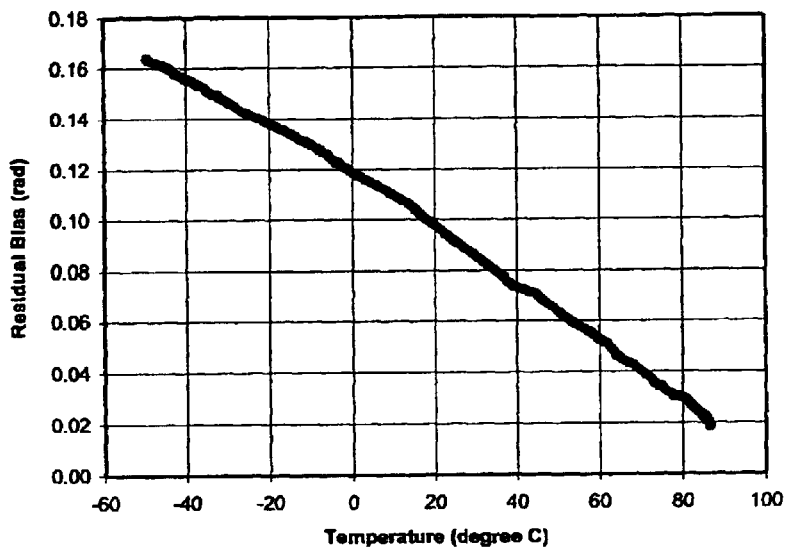
Figure 4. $\Delta\varphi_0$ as a function of temperature for a Pockels cell electric field sensor.
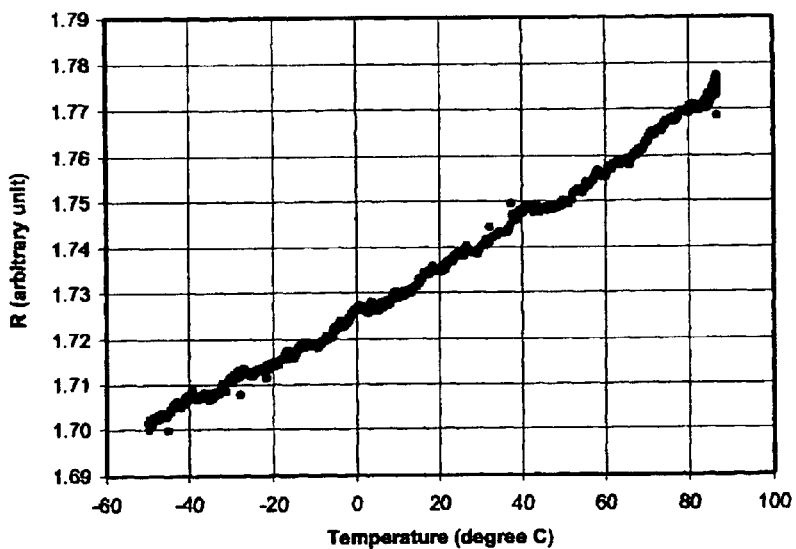
Figure 5. R (sensitivity to voltage) as a function of temperature, for the same EFS of Figure 4.

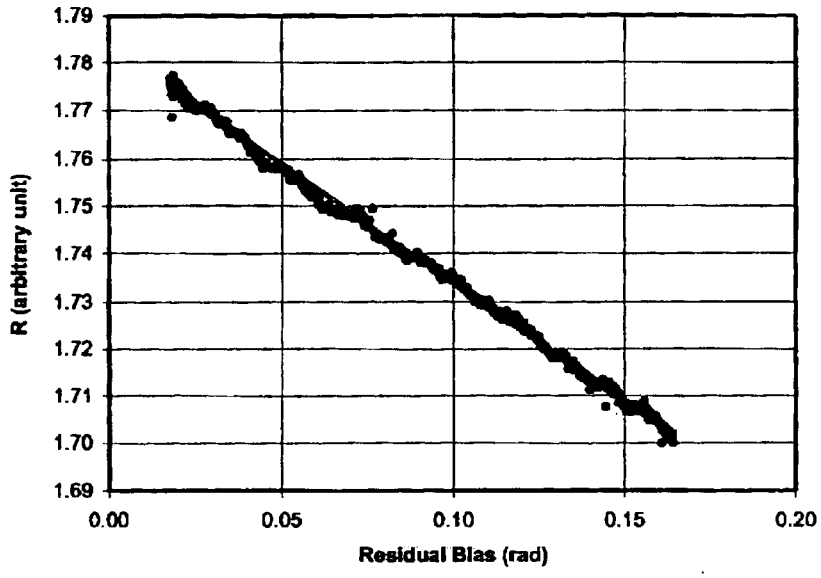
Figure 6. R as a function of $\Delta\varphi_o$, for the same EFS of Figures 4 and 5. The straight line represents a linear fit to the data.
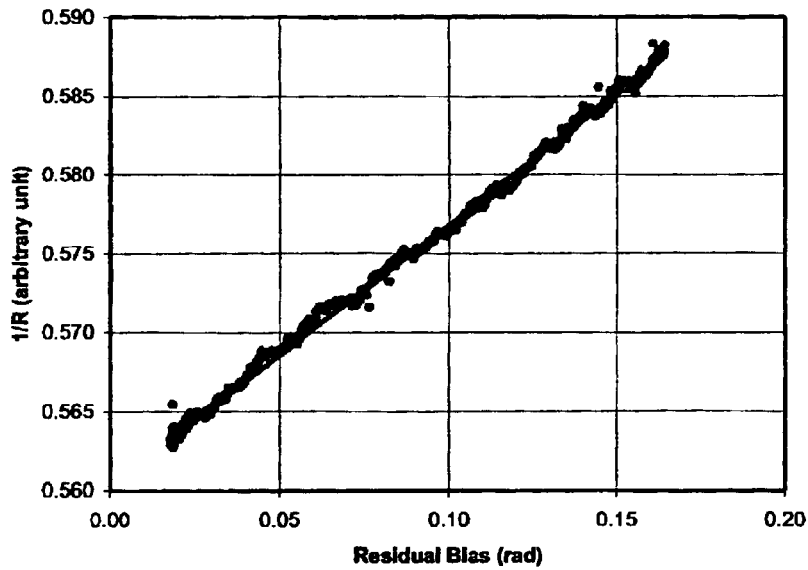
Figure 7. 1/R as a function of $\Delta\varphi_o$, for the same EFS of Figures 4, 5, and 6. The straight line represents a linear fit to the data.

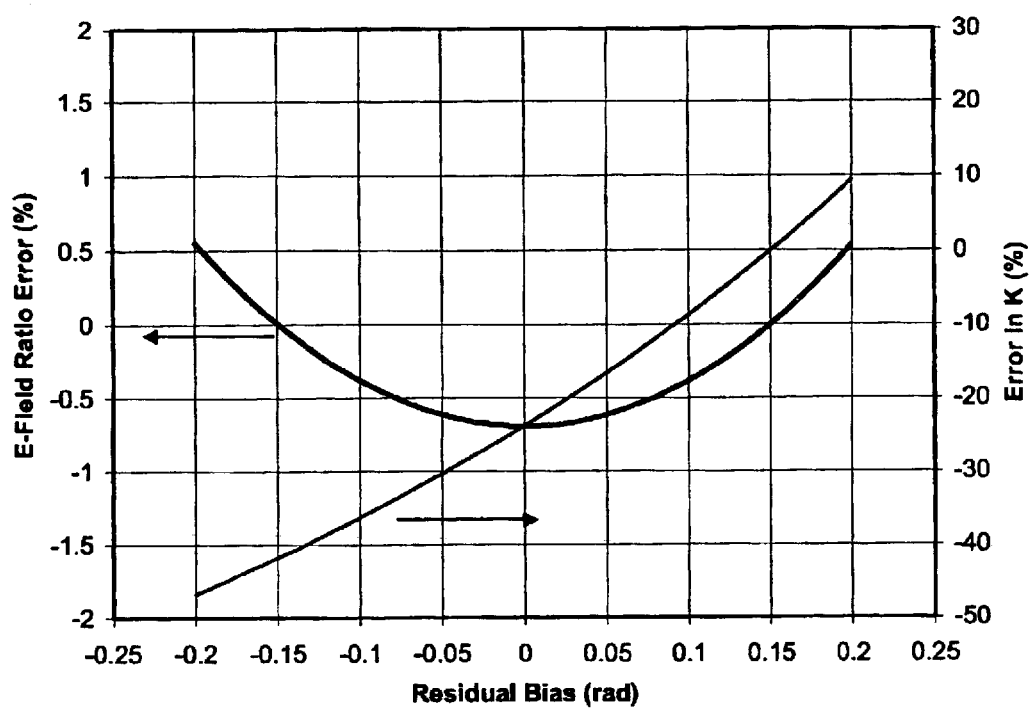

Figure 8. Error in AC electric field measurement and K factor measurement, as a function of true residual bias, $\Delta\varphi_o$, for a "wake-up time technique" using $\Delta\varphi_{oRef} = 0.15$ radian and assuming $E_o/E_\pi = 0.03$. Other parameters the same as those used in previous Figures. Note that error in measuring $E_o$ is approximately proportional to $[\cos(\Delta\varphi_{oRef})/\cos(\Delta\varphi_o) - 1]$.

OPTICAL ELECTRIC FIELD OR VOLTAGE SENSING SYSTEM

RELATED APPLICATION

This application claims the benefit of priority pursuant to 35 USC 119 of provisional patent application Ser. No. 60/337,820 filed 13 Nov. 2001, the disclosure of which application is hereby incorporated in its entirety by reference herein.

FIELD OF THE INVENTION

The present invention relates generally to optical sensors, and more particularly to those optical sensors that are responsive to an electric field or voltage, and systems incorporating such sensors for reliable and very accurate measurement of electric field and/or voltage.

DESCRIPTION OF THE INVENTION

Optical technology has attracted a great deal of attention in the past few decades due to various attractive features that it offers. These features may present great advantages over other technologies used for the same applications depending on the requirements of that application. For example, optical fibers are now widely used in the telecommunication industry due to various benefits that they offer including their low loss compared to electrical cables (copper wire), which allows for long cable runs before needing to amplify or regenerate the signals (much fewer repeaters needed). Other examples are optical sensors used in harsh environmental conditions of chemical or nuclear industry. Inert glass optical fiber is a great means of transporting signal (and data) without being affected by the chemical reaction being monitored, for example.

More specifically, in the electric power industry, optical fibers provide a great deal of attractive benefits, which may include the following: immunity to electromagnetic interference, galvanic isolation of sensors at high-voltage (HV) from ground potential (safety for the workers and equipment), galvanic isolation between HV lines (safety and reliability for equipment).

Optical voltage and current sensors in the HV industry may also offer the following advantages, among others, over conventional voltage and current transducers: lighter weight—resulting in faster and easier installation, and better seismic withstanding, higher accuracy, larger dynamic range of measurement, wider bandwidth, safer insulation design due the wide separation of HV and ground, use of more environmentally friendly insulation—elimination of need for oil and/or $SF_6$ gas for insulation.

Prior art optical voltage sensors and systems commonly employ optical electric field sensors to measure electric field, and, of course, voltage—the potential difference or voltage establishing the electric field. Prior art optical voltage sensors and systems, for example, are taught, among many others, in U.S. Pat. No. 6,252,388, entitled, "Method and Apparatus for Measuring Voltage Using Electric Field Sensors, and U.S. Pat. No. 6,380,725, entitled, "Voltage Sensor, both of which are incorporated herein by reference in their entirety. Commonly, such prior art optical voltage sensing systems include a sensing head and a remote system module connected via optical fibers for transmitting and receiving optical signals to and from the sensing head. It should be appreciated that the optical high voltage sensing head is generally intended to be spatially positioned within an insulator column, although not shown or described, herein, so as to be responsive to an electric field established by the voltage difference across the column as is well understood in the art. The remote system module, including light sources, optical signal detectors, signal processors, and the like, is generally spatially positioned away from the harsh high voltage environment.

As taught in the aforementioned patents, a voltage sensor employs an optical electric field sensing element that exhibits an electro-optic effect where transit time of light wave components of differing polarizations are affected differently in response to an electric field. One form of an optical electric field sensor, herein referred to as an EFS, is a Pockels Cell type sensor, similar to that disclosed in U.S. Pat. No. 5,029,273, entitled, "Integrated Optics Pockels Cell Voltage Sensor," the disclosure of which is incorporated by reference. Of course, other types of Pockels Cell type optical electric field sensing elements may be employed including, among others, bulk-optic sensors comprised of a crystalline material where differing polarization light wave components are affected differently in response to the presence of an electric field.

As indicated earlier, optical electric field sensing elements employed as part of an optical high voltage sensing head are particularly advantageous in the extreme high voltage environment. This is so, since only optical components are spatially positioned in the high voltage environment, including among others, optical fibers to route light waves into and out of the optical sensing element. In turn, optical photodetectors, signal conditioning circuitry, and signal processors to derive an output indicative of the voltage or electric field intended to be measured, are spatially positioned in the more benign electric field environment away from high voltage anomalies.

Although many improvements have been made in optical high voltage sensors and sensing systems, there remains a need for improved accuracy EFS sensing systems that have diminished sensitivities to lifetime and temperature variations in both electrical and optical system components. For example, optical component variations include those induced by ambient temperature variations, for example, variation in the power of the light source that produces the input light wave to the sensing head; and electrical component variations, for example signal conditioning amplifiers and photodetectors, before digital signal processing.

BRIEF DESCRIPTION OF THE INVENTION

An object of the invention is to provide a method and apparatus for enhancing optical voltage sensing system accuracy for lifetime and temperature induced changes in optical and electrical components of the sensing system.

In accordance with the present invention, an electric field sensing system for measuring an electric field includes a optical sensing head including (i) an optical electric field sensing element or sensor that exhibits an electro-optic effect where transit time of light waves of differing polarizations are affected differently in response to an electric field, (ii) an input optical circuit responsive to an input light wave for coupling first and second light wave components to the optical sensing element, and (iii) an output optical circuit coupled to the optical sensing element for splitting light exiting therefrom into third and fourth output light waves derived from the first and second light wave components, and directing said third and fourth light waves to impinge upon a first and second photodetectors, respectively. A signal processor derives a processor output signal, E, representative of the electric field intended to be measured as a sensing-system-specific characterized function, $G_x$, mathematically described by:

$$E = G_x\{a, b, E_\pi, \phi_o, K,\}$$

where,
- a and b represent resultant signal processor input signals derived from the pair of photodetectors of the electric field sensing system, including both optical and electrical signal losses along the way from the output of the optical electric field sensing element,
- $E_\pi$ is a sensing system specific parameter being substantially the average electric field required to a create in radians phase shift between first and second light wave components traveling from the input to the output of the optical sensing element in response to an electric field,
- $\phi_o$ is the intrinsic or inherent phase shift between the first and second light wave components derived from the signals a and b, and
- K is equal to the ratio $K_A/K_B$, where $K_A$ and $K_B$ are characteristic loss factors of the specific electric field sensing system, X, associated with said first and second processor input signals, respectively, derived from the signals a and b.

BRIEF DESCRIPTION OF THE DRAWINGS

FIG. 2 is a graphical depiction illustrating the relationship between an input electric field, E, intended to be sensed, and resulting output signals, a and b, for a sinusoidal 60 Hz signal electric field or voltage signal intended to be sensed.

FIG. 3 is a graphical depiction illustrating the transfer function of equation 4.

FIG. 4 is a graphical depiction illustrating the relationship of the residual bias, $\Delta\phi_o$, as a function of temperature for an optical electric field sensor.

FIG. 5 is a graphical depiction illustrating a plot of R described by equation 12 as a function of temperature.

FIG. 6 is a graphical depiction illustrating a plot of R as a function of $\Delta\phi_o$, combining the data from FIGS. 4 and 5, with a straight line representing a linear fit to the data.

FIG. 7 is a graphical depiction illustrating a plot of the inverse of R, namely 1/R, as a function of $\Delta\phi_o$, with a straight line representing a linear fit to the data.

FIG. 8 is a graphical depiction illustrating error in the measurement of an AC electric field intended to be measured as a function of the true $\Delta\phi_o$ residual bias.

DETAILED DESCRIPTION OF THE INVENTION

Figure 1:
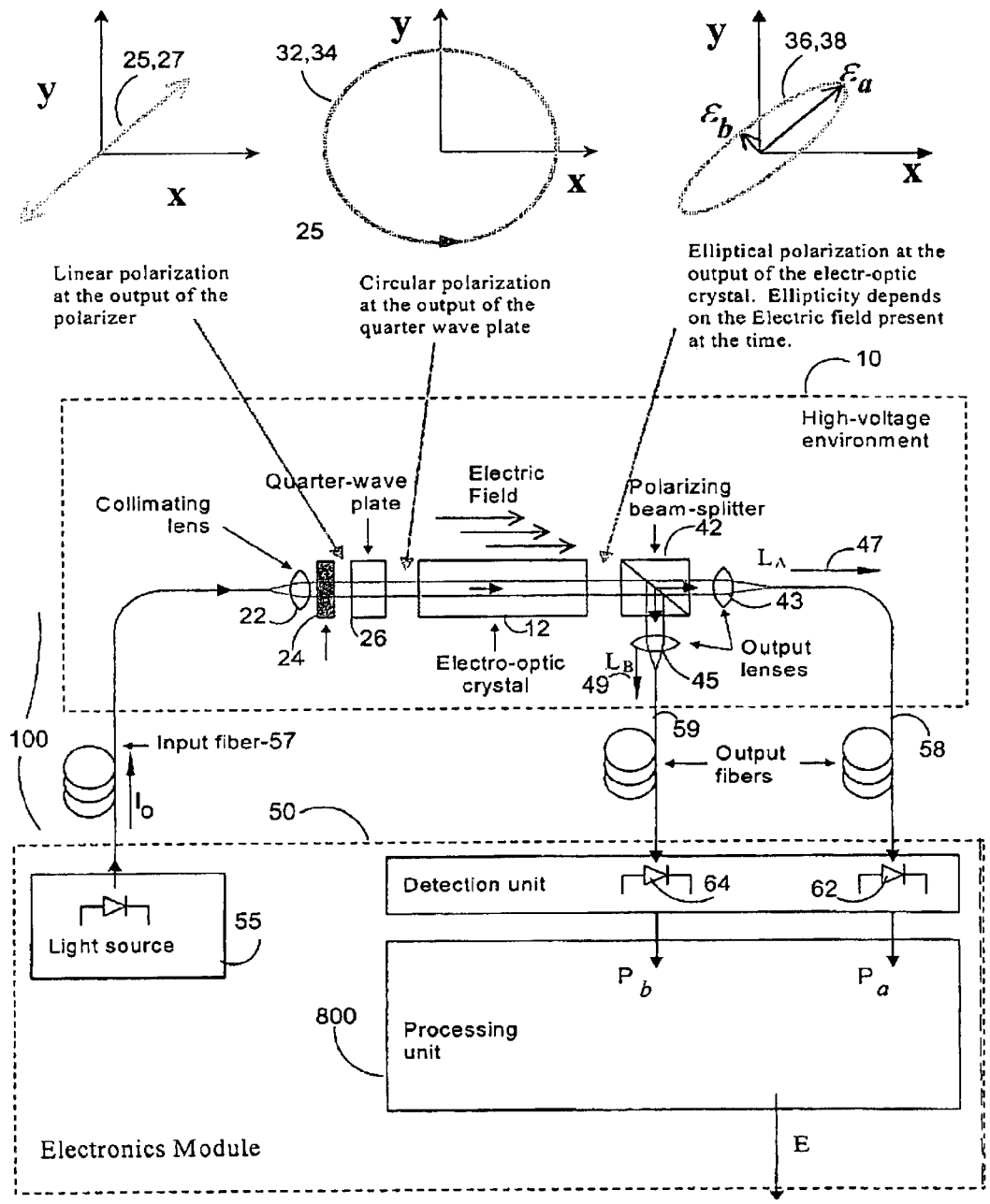
FIG. 1 is an exemplary embodiment of an optical electric field sensing system in accordance with the present invention.

Illustrated in FIG. 1 is a block diagram of one embodiment of an optical electric field sensing system 100 in accordance with the present invention including (i) an optical electric field sensing head indicated by block 10, in dashed line form, and (ii) a remote system module generally indicated by block 50, in dashed line form, including optical signal source 55, a pair of optical signal photodetectors, 62, 64, and a system signal processor 800.

The optical sensing head 10 is generally spatially positioned in a high voltage environment intended to measure an electric field established by a high voltage power line (not shown). The remote system module indicated by block 50 is generally spatially located in a "lower" voltage environment away from or shielded from the high voltage anomalies associated with power lines.

The optical sensing head 10 includes an optical electric field sensing element 12 illustrated as an electro-optic crystal where the speed of light for certain polarizations differs upon application of an electric field—e.g., an electro-optic crystal. Optical sensing head 10 further includes an input optical circuit for deriving from an input optical wave, $I_0$, from source 55 through optical fiber 57, a pair of first and second light wave components 32 and 34, and coupling these components to an input end of the optical sensing element 12; and an output optical circuit for splitting light exiting sensing element 12 into third and fourth light waves 47, 49, and directing these light waves to travel along optical fibers 58 and 59, respectively, so as to impinge upon photodetectors 62 and 64 respectively.

The exemplary input optical circuit illustrated in FIG. 1 includes collimating lens 22 for collimating the light out of the input fiber 57, polarizer 24 to establish a pair of linearly polarized light wave components 25, 27, and a phase retarder or phase separator in the form of a quarter-wave plate 26 to convert the pair of linearly polarized light waves to a circular polarized light wave having first and second light wave components 32 and 34. It should be noted that phase adjuster 26 establishes an intrinsic phase difference between the light wave components, along with any intrinsic phase difference induced by the sensing medium, as the light wave components travel through the sensing medium.

The exemplary output optical circuit illustrated in FIG. 1 includes a polarizing beam-splitter 42 to establish third and fourth light wave components 47 and 49, which in turn are coupled to respective lenses 43 and 45, respectively, for directing light into optical fibers 58 and 59, respectively, so that light therefrom impinges upon photodetectors 62 and 64, respectively.

As should be well understood by those skilled in the art, it is preferable that the total intrinsic phase difference between the first and second light wave components from input to output is 90 degrees, and may be implemented by imparting a 90 degree phase shift along the optical path from the first optical circuit to the second optical circuit before the third and fourth light wave components are derived. This phase shift may be imparted on the first and second light wave components either before or after, or throughout the sensing medium, or distributed both before and after the sensing medium.

It should be noted that the input and output optical circuit of the sensing head maybe constructed by way of a variety of components beyond that just described so as to achieved the intended function as already described, all of which is intended to be within the true spirit and scope of the preset invention.

Light source 55, the detection unit including photodetectors 62 and 64, and the signal processor 800 are usually constructed of electronic and/or opto-electronic components, and may be integrated in one electronics module or circuit card as is well known to those skilled in the art. Optical fibers 57, 58, and 59 effectively guide light waves between block 50 and the sensing-head 10 in the high-voltage environment. Use of optical fibers provides good isolation between the high voltage environment of the optical electric field sensing head 10 and the remote environment where the remote system module 50 is intended to reside.

It should be recognized that FIG. 1 illustrates the exemplary electric field sensing application where the sensor-head 10 is in the harsh environment of a high-voltage environment. The present invention is applicable to any harsh environment where isolation between the sensing-head and the remote system module 50 is desired, e.g., a chemically active or radioactive or any other unsafe environment, where the sensor-head may survive but the remote system module would not.

FIG. 1 illustrates the particular case where the optical electric field sensing element or sensor, herein referred to as the EFS, is a Pockels cell type optical electric field/voltage sensing element. The output optical circuit derives from the output light wave components 36 and 38 exiting from the electric field sensing element 12 two complementary optical output signals $L_A$ and $L_B$, light wave components 47 and 49, respectively. The first optical output signal or light wave, $L_A$, is the component of the sensing element 12 output that is polarized so as to be transmitted through the polarizing beam-splitter 42—polarized parallel to one axis of the polarization ellipse of the output of the electro-optic crystal as illustrated in FIG. 1. The second optical output signal or light wave, $L_B$, is the component of the sensing element 12 output that is polarized so as to be reflected by the polarizing beam-splitter—polarized parallel to the other axis of the polarization ellipse of the output light. Each of these light waves are optically transmitted via optical fibers 58 and 59 from the sensor-head 10 to remote system module 50, and specifically photodetectors 62 and 64 for converting optical signals to electrical signals, "$P_a$", and "$P_b$," for subsequent signal processing as will be further described.

Figure 9:
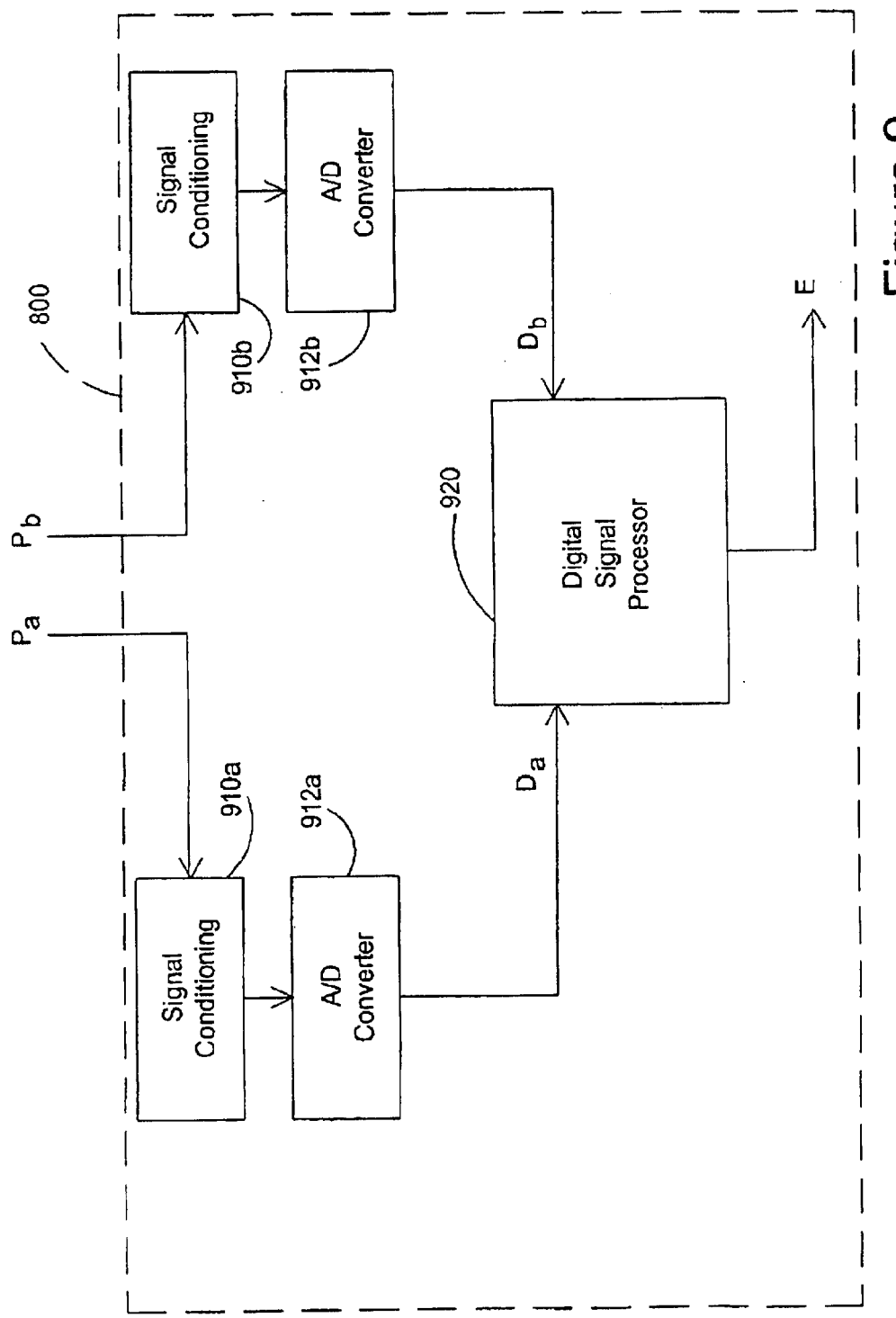
FIG. 9 is a block diagram of an exemplary signal processor in accordance with the present invention.

Details of signal processor 800 are more particularly illustrated in the block diagram of FIG. 9. The output electrical signals $P_a$, and $P_b$ from photodetectors 62 and 64, respectively, are typically signal processed by signal conditioning circuitry 910a and 910b, respectively, that may include amplifiers, limiters, filters, and the like, for obtaining a useful signal for digitalization. In turn each output of the signal conditioning circuitry 910a and 910b is presented to a respective analog-to-digital converter 912a and 912b, respectively, having digital outputs $D_a$ and $D_b$, respectively.

As illustrated in FIG. 9, signal processor 800 further includes a digital signal processor 920 for processing the digital signals $D_a$ and $D_b$. Digital signal processor 920 may be constructed by way of a wide variety of digital signal processors including microprocessors, computer, firmware, software, and the like for achieving the intended signal processing as will now be described.

In the following exposition, at any sampling time, signal "a" is a digital value representing light intensity $L_A$ after having been effected by all the losses and scale factor changes through its transmission and conversion from optical intensity to an electrical analog or digital signal value; i.e., $a = K_A \times L_A$. Similarly, $b = K_B \times L_B$. In accordance with the present invention, signal representations "a" and "b" are the resultant signals or measurements represented by $D_a$ and $D_b$, respectively, operated on by digital signal processor 920 in order to determine the electric field or voltage intended to be measured.

A transfer function of the optical electric field sensing system employing a Pockels cell EFS, hereafter referred to as the EFS sensing system, may be mathematically described by:

$$a = \frac{P_0 K_A}{2}\left[1 + \alpha\cos\left(\frac{\pi\Sigma}{E_g} + \varphi_0\right)\right] \quad (1.a)$$

$$b = \frac{P_0 K_B}{2}\left[1 - \alpha\cos\left(\frac{\pi\Sigma}{E_\pi} + \varphi_0\right)\right] \quad (1.b)$$

where, a and b represent resultant signals derived from the photodetector output signals ($D_a$ and $D_b$) of the electric field sensing system, including both optical and electrical signal losses along the way from the output of the optical electric field sensing element, $P_o$ is the total optical power intensity of the input wave $I_0$ entering the sensor-head, E is the electric field along the length of the electro-optic crystal or the average electric field over the chosen sensor length, $E_\pi$ is the (average) electric field required to create $\pi$ radians phase shift between orthogonal optical polarization components traveling in the electro-optic crystal (32,34), $\phi_o$ is the bias or intrinsic phase shift between the optical polarization components traveling in the electro-optic crystal (mostly controlled by the quarter-wave plate in the embodiment shown in FIG. 1), α is a number between 0 and 1 (very close to 1 for a good EFS), and $K_A$ and $K_B$ are the loss factors for signals a and b, respectively.

$E_\pi$ is basically a measure of the sensitivity of the EFS and is dependent on many physical and geometrical parameters such as optical wavelength, the electro-optic coefficients of the electro-optic crystal, its refractive index, and many other parameters. For a comprehensive discussion on electro-optic phase modulation and sensors, reference is hereby made to T. Tamir (Ed.), entitled, "Guided-Wave Optoelectronics", $2^{nd}$ Edition, Springer-Verlag, 1990, and A. Yariv, and P. Yeh, entitled, "Optical Waves in Crystals", John Wiley & Sons, 1984, which are herein incorporated by reference in their entirety.

The value of a, a measure of the goodness of the EFS within the sensor head, is usually less than 1.0, the value for an ideal EFS. However, the value of a is more typically slightly less than 1.0, e.g., 0.99, due to practical limitations in manufacturing an EFS, e.g., misalignment of the optical components in the sensor-head.

The value of $\phi_o$, a measure of the bias or initial phase shift between the two optical polarization components traveling in the electro-optic crystal, is mostly determined by the quarter-wave plate which is typically designed so that $\phi_o$ is close to $\pi/2$ radians or odd multiples thereof. In these circumstances, the optical electric field sensing system transfer function of equations 1.a and 1.b may be rewritten as follows:

$$a = \frac{P_0 K_A}{2}\left[1 + \alpha\sin\left(\frac{\pi\Sigma}{E_\pi} + \Delta\varphi_0\right)\right] \quad (2.a)$$

$$b = \frac{P_0 K_B}{2}\left[1 - \alpha\sin\left(\frac{\pi\Sigma}{E_k} + \Delta\varphi_0\right)\right] \quad (2.b)$$

where, $\Delta\phi_o = \phi_o - \pi/2$, the residual bias of the EFS.

Commonly, a Pockels cell EFS system uses only one of the two output components, a or b, as illustrated in FIG. 1, and mathematically described by the sensing system transfer function equation pairs 1 and 2. FIG. 2 is a graphical depiction illustrating the relationship between an input electric field, E, intended to be sensed, and resulting output signals, a, and b, for a sinusoidal 60 Hz signal:

$$E = E_o \sin(\omega t) \quad (3)$$

Where, $E_o$ is the amplitude of the input electric field, $\omega$ is the angular frequency, where $\omega = 2\pi f$, t is time, and f is the frequency of the electric field, here 60 Hz.

The purpose of signal processor 800 is to accurately determine a value E representative of the electric field intended to be measured using resultant signals a and/or b, in accordance with some form of a predetermined sensor transfer function. It is important to note that signals a, b, and various parameters of the transfer function of the EFS system may change due to changes in various parameters such as temperature, change of intensity of the input light source, $P_0$, and vibration, and the like. In accordance with the present invention, the optical electric field sensing system and its associated signal processor 800 provide an accurate sensor electric field measurement "E" by taking into consideration the aforesaid effect of changing parameters that may affect the overall transfer function of the EFS sensing system.

One parameter, the input light intensity, $P_0$, may vary or fluctuate due to vibration, aging of the light source, or other causes. In accordance with the present invention, the effect of variation in the input light intensity, $P_0$, on the resultant measurement of E may be diminished by "normalizing" the EFS sensing system output signals, a and/or b, so that resultant sensor system output value E may be derived such that it will not be sensitive to optical light intensity or power fluctuations. Using equations (2.a) and (2.b), a "normalized transfer function" may be derived by dividing the EFS sensing system signal outputs a by (a+Kb), where $K=K_A/K_B$ as follows:

$$S_A = \frac{a}{a+Kb} = \frac{1}{2}\left[1 + \alpha\sin\left(\frac{\pi\Sigma}{E_\pi} + \Delta\varphi_0\right)\right] \quad (4)$$

It should be noted that other forms of the transfer function (4) are of course possible that may be employed that are effectively equivalent to that mathematically expressed in equation (4) for purposes of enhance accuracy of the measurement of E as described herein. For example, the expression just above may be replace by $$S'_A = \frac{a-Kb}{a+Kb} \quad (4b)$$

Even though $S'_A$ may have the benefit of better signal-to-noise ratio compared to $S_A$, the matters disclosed in this invention equally apply whether $S_A$ or $S'_A$, or the like, are used.

Also illustrated in FIG. 2 is a graphical depiction of $S_A$ as a function of time for the given electric field E, resultant sensor output signals a, b, and ratio K, where, $P_0=1.0$, $K_A=0.9$, $K_B=0.81$, K=1.111, $\alpha=0.90$, $\Delta\phi_o=0.0$, $\pi E/E_\pi=0.01$.

FIG. 3 illustrates a graphical depiction of a plot of the transfer function (4) with for an example set of EFS sensing system parameters as just recited. The most linear portion of the transfer function is generally indicated by the dashed rectangle.

The inverse transfer function is mathematically expressed as:

$$E = \frac{E_\pi}{\pi}\left[-\Delta\varphi_0 + \text{Arcsin}\left[\left(\frac{2}{\alpha}\right)*\left(\frac{a}{a+Kb}\right) - 0.5\right]\right] \quad (5)$$

Assuming the values of sensing system specific parameters $\alpha$, K, $\Delta\phi_o$, and $E_\pi$ are known, the value of the electric field may be calculated as a function of resultant signals a and b using equation (5) by way of signal processor 800. A specific electric field sensing system, X, may be characterize, in part, by empirically determining sensor system parameter values for $\alpha$ and $E_\pi$. For example, the values of $\alpha$ and $E_\pi$ (or other values effectively equivalent to these two characterizing parameters) may be measured by calibrating the specific EFS sensing system under known electric fields before using the EFS sensing system to measure unknown electric fields. The parameter "K" depends on all of the optical and electrical losses in the signal path for signals "a" and "b" and may be measured and/or controlled for a particular EFS sensing system as will be further described. The residual bias parameter of the EFS sensing system, $\Delta\phi_o$, depends on the actual bias, and, in accordance with the present invention, may also be measured and/or controlled.

The electric field intended to be measured may be expressed in the form given by equation (3) given the assumption that the electric field is dominantly a simple sinusoidal alternating signal, as is typically the case in electric power systems. Accordingly, the parameter K may be determined using equations (2) and (3). The parameter K is equal to peak-to-peak value (or some AC rms value) of sensor signal "a" divided by the peak-to-peak (or similar AC rms) value of sensor signal "b":

$$K = \frac{K_A}{K_B} = \frac{A_{AC}}{B_{AC}} \quad (6)$$

where $A_{AC}$ and $B_{AC}$ are proportional to the absolute value of the magnitude (e.g., root-mean-square, peak-to-peak, or amplitude, or the like) of the alternating components of sensor signals a and b. For example, for a value of residual bias $\Delta\phi_o$ close to zero, and for E much smaller than $E_\pi$ (a very typical and practical case), one may write:

$a = A_{DC} + a_{AC}$ $b = B_{DC} + b_{AC}$ or $a \approx A_{DC} + A_{AC}\sin(\omega t) \quad (7.a)$ $b \approx B_{DC} - B_{AC}\sin(\omega t) \quad (7.b)$ where, $A_{DC}$ and $B_{DC}$ are the DC or average values of sensor signals a and b, and $A_{AC}$ and $B_{AC}$ are the amplitude of the alternating signal components of sensor signals a and b.

Calculating K in this manner is essentially made possible by a key property of the Pockels cell EFS: Namely, any light that is not guided to channel A is guided to channel B, i.e., ideally $A_{AC}=B_{AC}$ which essentially is the basis of operation of the Pockels cell shown in FIG. 1. In practice, the two sensor signal output components will experience different losses and gains in their optical paths and in their electronic signal paths such that $A_{AC}=K \times B_{AC}$.

Once K is calculated using equations (6) and (7) above, one may dynamically calculate $\Delta\phi_o$ using the mathematical expression of equations (3) and (5):

$$E_0 \sin(a\pi) = \frac{E_\pi}{\pi}\left[-\Delta\varphi_0 + \text{Arcsin}\left[\left(\frac{2}{\alpha}\right)*\left(\frac{a}{a+Kb} - 0.5\right)\right]\right] \quad (8)$$

The average value of equation (8) over time is equal to zero, hence:

$$\Delta\varphi_0 = \text{Average}\left\{\text{Arcsin}\left[\left(\frac{2}{\alpha}\right)\left(\frac{a}{a+Kb} - 0.5\right)\right]\right\} \quad (9)$$

Accordingly, for an alternating current signal, the parameters K and $\Delta\phi_o$ may be dynamically measured and adjusted. Note that the parameters K and $\Delta\phi_o$ may and probably will change over time as functions of various other parameters. For example, in an electric field sensor head, the parameter $\Delta\phi_o$ may change as a function of the temperature, particularly that of the quarter-wave plate 26 of the input optical circuit illustrated in the embodiment shown in FIG. 1. Further, the parameter "K" may change due to drift in the gain of a photo-detector in the detection unit over time. However, these changes are relatively slow.

Figure 10:
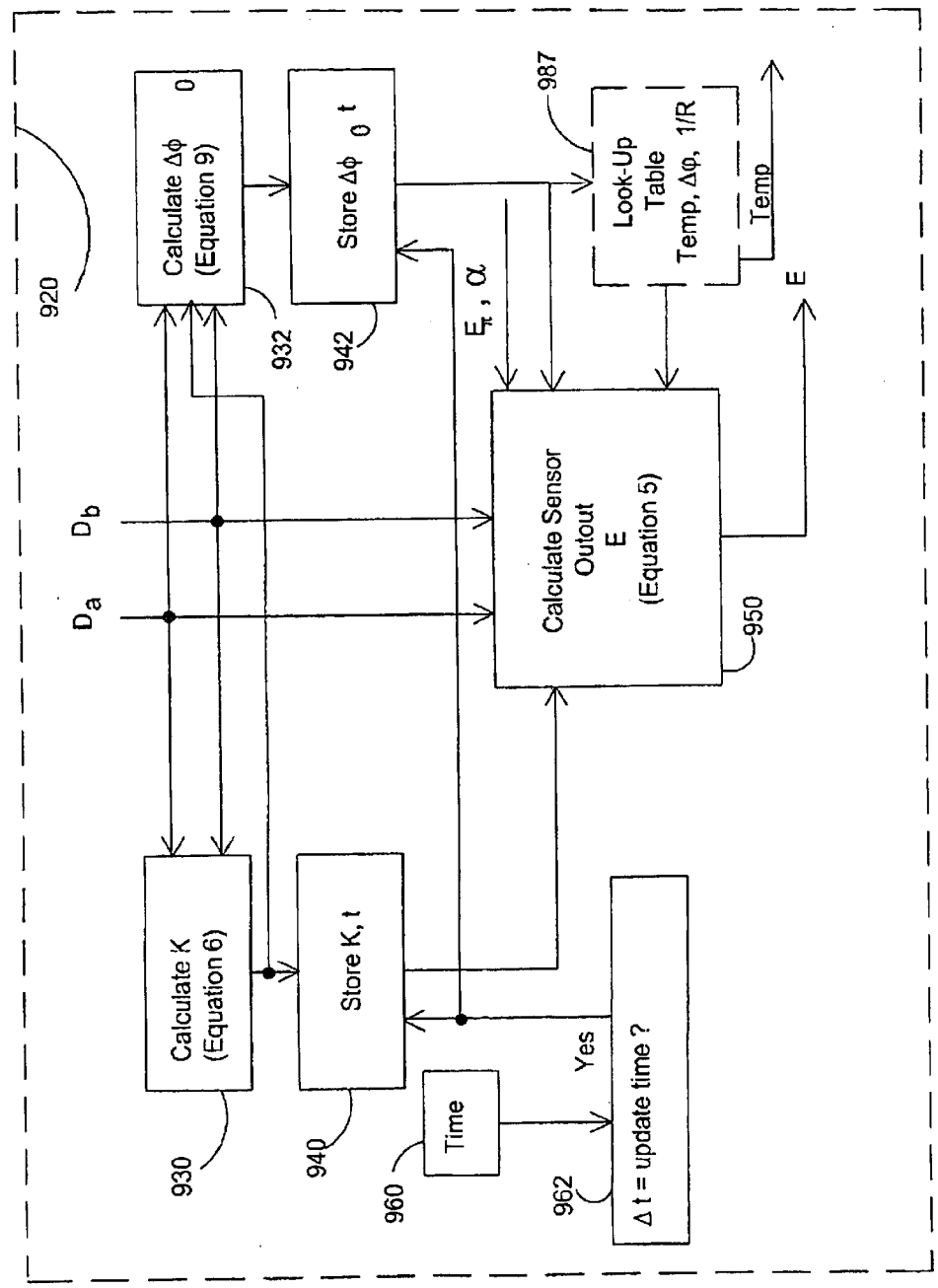
FIG. 10 is a block diagram of an exemplary digital signal processor of that depicted in FIG. 9.

In accordance with one embodiment of the present invention particularly illustrated in FIG. 10, signal processor 800, specifically digital signal processor 920, is operative for periodically updating the characterizing parameters, K and $\Delta\phi_o$, i.e., periodically calculating new values for parameters K and $\Delta\phi_o$, and also tracking their values over time. For example, temperature may change at a rate of 20 Kelvin/hour, and temperature dependence of $\Delta\phi_o$ may be ~0.001 radian/Kelvin, resulting in 0.02 radian/hour change in $\Delta\phi_o$. Parameters K and $\Delta\phi_o$ may be calculated every 10 seconds, for example, allowing for better than 0.02/360=0.000056 radian accuracy in knowing $\Delta\phi_o$ at any time. In summary, if any changes in K and/or $\Delta\phi_o$ are measured accurately, and therefore, K and $\Delta\phi_o$ are always well known, then they will not contribute to any significant error in use of equation (5) or (8) for determining electric field E intended to be measured.

Furthermore, the ability to measure the parameters K and $\Delta\phi_o$ dynamically or frequently, allows for building highly accurate sensors that are relatively immune to temperature or light intensity fluctuations. For example, if over time (e.g., days), an amplifier that amplifies the signal received on a photo-detector (where $L_B$ is measured) has a gain change due to some thermal effect, i.e., $K_B$ is changed, calculating and adjusting K frequently will eliminate the possibility of introducing an error in the electric field measurement when the inverse transfer function, equation (5) is used.

Temperature Sensor

Figure 11:
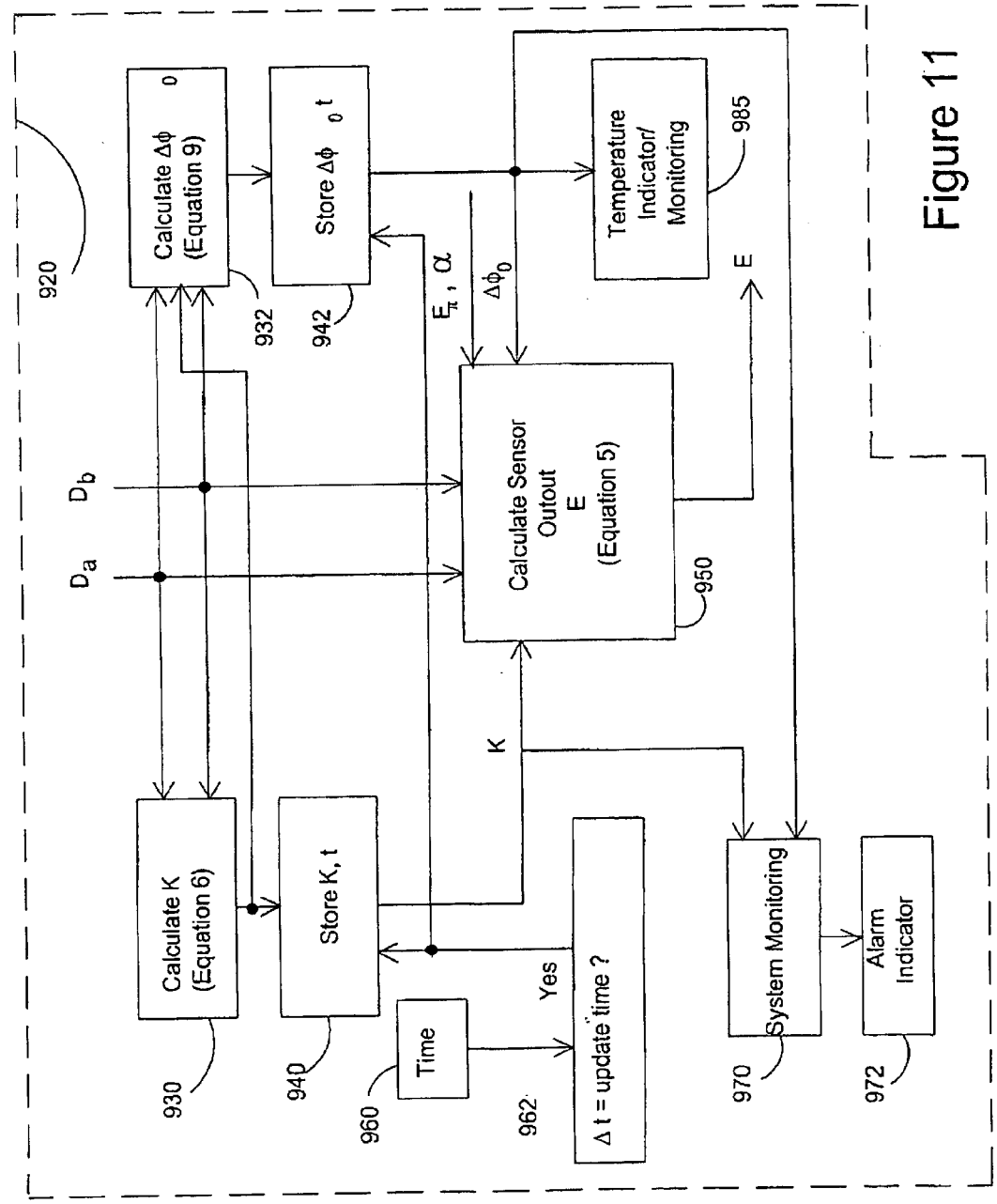
FIG. 11 is another block diagram of an exemplary digital signal processor of that depicted in FIG. 9 having further optional functions in accordance with the present invention.

In accordance with another aspect of the present invention particularly illustrated in FIG. 11, tracking the parameter $\Delta\phi_o$ permits the electric field sensor to be also used as a temperature sensor. The EFS sensing system may be characterized over temperature, in a test chamber for example, so that the relationship between its bias, or residual bias, $\Delta\phi_o$, and temperature is well characterized. This is particularly illustrated in FIG. 10 by way of a look-up table indicated by block 987. Then the measurement of bias may be used to measure and/or estimate the ambient temperature at the sensor-head spatial location, thereby serving, in part, as a sensing head, and more particularly a high voltage insulator column temperature sensor.

FIG. 4 graphically depicts the relationship of the residual bias, $\Delta\phi_o$, as a function of temperature for an EFS. Knowledge of temperature may be used for many applications, including compensating for temperature dependence of the sensitivity of the EFS itself. In a simplified form, the sensitivity of the EFS is mainly given by the value $E_\pi$ in equations (1), (2), (4), (5) and (8) above. $E_\pi$ may be determined using equation (8) where all other sensor parameters and $E_o$ are already known. Equation (5) may be rewritten as:

$$Y = \frac{\pi E}{E_\pi} + \Delta\varphi_0 = \text{Arcsin}\left[\left(\frac{2}{\alpha}\right)*\left(\frac{a}{a+Kb} - 0.5\right)\right] \quad (10)$$

Using equations (3) and (10), the amplitude of the AC portion of Y divided by $E_o$, i.e., $Y_{AC}/E_o$, will be inversely proportional to $E_\pi$ and may be used as a measure of the sensitivity of the sensor. The DC portion of Y is practically equal to $\Delta\phi_o$ (for $E/E_\pi$ much smaller than 1).

Accordingly, an electric field sensor may be characterized in the following exemplary manner. Consider, for example, applying a voltage V across a pair of electrodes, which are separated at a constant distance, to create an electric field E between them in spatial proximity to an EFS sensor within a test chamber. For an applied sinusoidal voltage between the terminals, the voltage across the terminal may be expressed as:

$$V=V_o \sin(\omega t+\delta)=CE_o \sin(\omega t), \quad (11)$$

where the parameters C and $\delta$ depend on the geometry and the properties of the materials in this environment, including the EFS sensor itself.

If we define R as:

$$R=Y_{AC}/V_o, \quad (12)$$

the value of the parameter R may be used as a measure of the sensitivity of the EFS.

In accordance with another aspect of the present invention, the EFS may be characterized in terms of the parameter values "R" and $\Delta\phi_o$ as a function of temperature. These parameters may be stored and utilize by the signal processor 800, and more specifically by calculation block 950 of digital signal processor 920 illustrated in FIG. 10, in order to compensate for EFS sensing system output signals for temperature variations in the sensitivity of the EFS.

The signal processor 800, in accordance with one aspect of the present invention, is configured for re-calculating $\Delta\phi_o$ frequently (as explained above) as particularly illustrated with reference to digital signal processor 920 illustrated in FIG. 10. Using the stored characterization information of the EFS sensing system, the temperature of the EFS may be calculated (or looked up) from $\Delta\phi_o$; and again, using the stored characterization information, the sensitivity adjustment factor for the EFS at that temperature may be looked up (or calculated).

Alternatively, instead of going through a two-step process, from $\Delta\phi_o$ to temperature, and from temperature to R, a single-step process may employed going directly from $\Delta\phi_o$ to R. The relationship between $\Delta\phi_o$ and R may be obtained through sensor sensing system characterization, and may, for example, be stored as a look up table, block 987 in FIG. 10, or as a predetermined function of $\Delta\phi_o$ calculated by way of signal processor 800.

FIG. 5 graphically depicts a plot of R as a function of temperature for the same sensor of FIG. 4. FIG. 6 graphically depicts a plot of R as a function $\Delta\phi_o$, combining the data from FIGS. 4 and 5. FIG. 7 graphically depicts a plot of the inverse of R, namely 1/R, as a function of $\Delta\phi_o$, that may be stored in the processing unit and be used for compensating the temperature dependent sensitivity variation of the EFS. In summary, using the above techniques, a "self temperature compensated" electric field sensor system may be obtained.

EFS Sensing System Condition Alarms

Another advantage of measuring and updating parameters K and $\Delta\phi_o$ frequently is that the measured values may be used for monitoring the EFS sensing system, and alarming against any unusual conditions; i.e., allow for and improve "self monitoring" of the EFS sensing system. This aspect of the present invention is particularly illustrated in FIG. 11 where digital signal processor 920 is configured to include parameter monitoring indicated by block 970 and a designated alarm indicator or function indicated by block 972 responsive to system monitoring block 970. As indicated earlier, functions such as these and others may be accomplished by way of hardware, software, firmware, and the like, the details of which are well within the skill of the artisan and not described herein.

For one exemplary alarm function, if K becomes significantly larger than 1 (e.g. K~10), it could mean that the sensor "b" signal is becoming very weak. Perhaps some optical connector in the path of that signal is degrading, or a photo-detector in the path of that signal is failing.

Another exemplary alarm function is that if the residual bias is a value out of the expected range for all possible temperature conditions, see FIG. 4 for example, then the EFS sensor system may yield an alarm indicating that there is some problem in the EFS sensing system. For example, if at the installation of the EFS sensing system, the output fibers that are supposed to be connected to channel A and channel B photo-detectors are reversed by mistake, the measured bias will be different (typically reversed sign); e.g., for the EFS depicted in FIG. 4, instead of $\Delta\phi_o$ being a value between 0.01 and 0.2 radians, it will be a value between −0.01 and −0.2. In summary, many "self monitoring" features for the EFS sensing system may be implemented and/or enhanced using these principles of the present invention.

The method taught above for measuring EFS sensing system parameters K and $\Delta\phi_o$ uses the presence of an AC electric field at the location of the sensor to calculate K and $\Delta\phi_o$ accurately and frequently in order to maintain accurate electric field measurement. If the AC electric field is interrupted or distorted for a while, the accuracy of the system is typically still maintained since the values of K and $\Delta\phi_o$ don't typically change rapidly. Of course, some additional logic and/or processing may be required in order to make sure wrong values do not get calculated.

For example, a logic rule may be as follows: if the values of $A_{AC}$ and/or $B_{AC}$ (see equation (7)) are less than certain minimum values, it should be interpreted as having no or low electric field at the location of the sensor and K should not be updated using these low and, perhaps, inaccurate values—thus avoiding an incorrect determination of the value of K and subsequent electric field measurements.

Zero Wake-Up Time Feature

In another scenario, when powering up a sensor system that uses electronics, for example, after any major service of the system, there will be some delay time required (perhaps several seconds or minutes) for the electronics to boot up and warm up to equilibrium. This time is referred to as "warm-up" time. Further, when any sensor system is used for measuring electric field, voltage, or current, of a power transmission line, there may be a time delay between the energization of the power transmission line and the time when the output of the sensor is valid. This time delay is referred to as "wake-up" time.

It should be noted however that wake-up time should not be confused with "warm-up" time. Warm up time has to do with the "energization of the electronics part of the sensor system". The wake-up time is the time it takes from "the presence of the parameter to be measured (e.g., HV related electric field) until it is correctly measured and presented." The warm-up time may be several minutes without causing any inconvenience in a permanent installation. However, the wake up time is typically expected to be very low, depending on the application.

The electric field sensors described herein may be used for measuring voltage on HV transmission lines. The voltage may need to be known for various applications including protection and metering applications. For metering applications the accuracy required is typically much more stringent, however a wake-up time of several seconds may be tolerated. For example, if the electric power to be measured needs to be accurate with an uncertainty less than 0.2% for the monthly electricity bill (revenue metering application), >0.2% inaccuracy, or even total loss of data, over one minute will not affect the monthly bill significantly (one month is approximately 60×24×30=43200 minutes).

For a protection application, however, a very low wake-up time is required. Typically, a fault needs to be cleared in several milli-seconds after it appears on the power transmission line. Some faults may happen exactly when the transmission line is energized. In these cases, the wake-up time, for protection applications, needs to be very short, ideally zero. On the other hand, the accuracy requirement for protection applications is not as stringent, for example, the International Standard—Instrument Transformers—Part2, IEC 60044-2, specifies a class 3P protection voltage sensor that may have an uncertainty of up to 3% in its measurement. The techniques explained herein for continuous measurement and monitoring of K and $\Delta\phi_o$ imply that the wake-up time of the sensor is not zero.

The following exposition describes a "zero wake-up time" EFS sensing system in accordance with one embodiment of the present invention of the type explained above so as to produce and electric field output signal that satisfies both metering applications (accurate but slow) and protection applications (not so accurate but fast). The zero wake-up time function in accordance with the present invention is particularly illustrated in the combination block and flow diagram of FIG. 12 which depicts another functional arrangement for digital signal processor 920, as will subsequently be described.

The "zero wake-up time" scheme employed in accordance with the present invention may be described as follows: signal processor 800 of FIG. 1, more specifically digital signal processor 920 of FIGS. 9 and 12, may implement a start up routine that uses DC values of the resultant signals $D_a$ and $D_b$, represented by $A_{DC}$ and $B_{DC}$, respectively, as expressed in equations (6) and (7) for mathematically describing the value of K. The process involves a first step which obtaining an estimated or characterized value of the residual bias $\Delta\phi_{oRef}$, from characterization data, like that illustrated in FIGS. 4 to 7.

Then K may be calculated from bias $\Delta\phi_{oRef}$ and $A_{DC}$ and $B_{DC}$ in the absence of electric field (E=0) using equations (2) or (9) and (7):

$$K = \frac{A_{DC}}{B_{DC}} \times \frac{(1 - \alpha\sin(\Delta\varphi_0))}{(1 + \alpha\sin(\Delta\varphi_0))} \quad (13)$$

The goal is to calculate the EFS sensing system parameters K and $\Delta\phi_o$ just accurately enough so that the errors in E associated with inaccuracies in K and $\Delta\phi_o$ when using the inverse transfer function of equation (5) to measure E are sufficiently low for a protection application.

So, for the protection application, a wake-up time of zero may be achieved in this manner. During the first few seconds after the AC voltage becomes present on the HV transmission line, K and $\Delta\phi_o$ are recalculated more precisely, as described previously, and higher accuracy appropriate for metering is achieved. In other words, the wake-up time of the EFS sensing system for protection level accuracy is zero (where it matters), but the wake-up time for metering level accuracy is several seconds (where it does not cause any problems).

Using a specific example to show the "zero wake-up time" technique, assume an EFS sensing system having performance as depicted in FIGS. 4 to 7, and that the sensor system needs to be used for both metering and protection applications. For the metering application, it is expected to meet IEC 60044-7 class 0.5 accuracy. Class 0.5 requires that the uncertainty or error in the amplitude of the AC signal measured by the sensor to be less than 0.5%. For the protection application, the sensor is expected to meet IEC 60044-7 standard class 6P. Class 6P requires that the uncertainty or error in the amplitude of the AC signal measured by the sensor to be less than 6%.

FIG. 5 shows that if the EFS sensor is not compensated, the sensitivity of the electric field sensor, R, may vary by about ~5% (from 1.70 to 1.78). So, if R is assume to be 1.74 at all time, it (inaccurate R or $E_\pi$) will contribute between −2.5% and +2.5% error to the value of E calculated using the inverse transfer function of equation (5). It leaves between −3.5% and +3.5% allowance for error contribution from inaccuracies in K and $\Delta\phi_o$.

FIG. 4, shows that the residual bias of the sensor will be between 0 and 0.2 radians. If we assume the residual bias is 0.15 ($\Delta\phi_{oRef}$=0.15), K may be calculated in accordance with equation (13) as expressed in equation (14) below using the average values of sensor signals $D_a$ and $D_b$, namely $A_{DC}$ and $B_{DC}$, respectively:

$$K_{initial} = \frac{A_{DC}}{B_{DC}} \times \frac{(1 - \alpha\sin(\Delta\varphi_{0Ref}))}{(1 + \alpha\sin(\Delta\varphi_{0Ref}))} \quad (14)$$

FIG. 8 shows the error in the measurement of AC electric field performed by the EFS sensing system as a function of the true $\Delta\phi_o$, when a value of $\Delta\phi_{oRef}$=0.15 is used as explained in the previous paragraph.

FIG. 8 shows that the error in calculating electric field due to incorrect K and $\Delta\phi_o$, for all possible values of $\Delta\phi_o$ (between 0 and 0.2 radian here) is less than 1%. For values $E_o/E_\pi$ much less than one (e.g., <0.03 is a common and practical case), the error in measured electric field $E_o$ shown in FIG. 8 is proportional to the error in the slope of the transfer function assumed (error in slope~[cos($\Delta\phi_{oRef}$)/cos ($\Delta\phi_o$)−1], see equation (4)).

The "zero wake-up time" technique, exemplified above, uses the characteristic of the slope of the transfer function of the EFS sensing system to achieve moderate accuracy at start-up. For values of $\Delta\phi_o$ close to zero at all practical temperatures of interest, e.g., $\Delta\phi_o$ between −0.2 and 0.2 radian, which is a very easy and practical case, the transfer function (see FIG. 3, or equations (4) and (5)) is quite linear with a relatively constant slope. Using incorrect bias and using DC values of sensor signals a and b may contribute some error to calculating K, but use of inaccurate K calculated in this manner does not result in unacceptably inaccurate AC electric field measurement (see FIG. 8). Effectively, since the "wrong" K is based on a "wrong" $\Delta\phi_o$, they mostly cancel the effect of each other. While, this method may be used to achieve 6% accuracy upon HV start up for a protection application, after the presence of AC signal on the HV line for a while, e.g., 10 seconds, accurate K and $\Delta\phi_o$ may be calculated as explained in the earlier sections of this document to achieve better than 0.5% uncertainty required for metering in the example given above.

A simple procedure for choosing $\Delta\phi_{oRef}$ to be used in the zero-wake-up-time routine above may be given as follows:

If the residual bias, $\Delta\phi_o$, over the temperature range of interest changes between two extremes, one may find the maximum and minimum values of $\cos(\Delta\phi_o)$, $\cos_{max}(\Delta\phi_o)$ and $\cos_{min}(\Delta\phi_o)$, respectively, and use $$\Delta\phi_{oRef}=\pm\text{Arccos}\{[\cos_{max}(\Delta\phi_o)+\cos_{min}(\Delta\phi_o)]/2\}. \quad (15)$$

The choice of + or − sign depends on the typical value of $\Delta\phi_o$ over the temperature range of interest for the particular sensor being used. If $\Delta\phi_o$ is typically positive, then positive is recommended to be used; if $\Delta\phi_o$ is typically negative, then negative sign is recommended to be used; nevertheless, either will work.

Moreover, if the temperature of the sensor is known accurately, the $\Delta\phi_o$ versus temperature characterization table of the sensor, as graphically depicted in FIG. 4, may be used to estimate $\Delta\phi_{oRef}$ very accurately so that it is very close to true value of $\Delta\phi_o$. In this case, a wake-up time of zero may be achieved while guaranteeing much higher accuracy (e.g., metering accuracy class 0.2% of IEC 60044-7). If the temperature is not accurately known, but may be estimated with some error bounds, e.g., ±10° C., the $\Delta\phi_o$ versus temperature characterization table may be divided into a few regions, e.g., 6 regions of 20° C. span to cover 120° C. temperature variation, and then the zero-wake-up-time routine given above may be used within each region (i.e., one $\Delta\phi_{oRef}$ calculated using equation (15) for each region) to guarantee more accurate measurement of electric field at HV energization time.

For example, for the EFS depicted in FIGS. 4, the operating range may be divided into 7 segments, each covering say, ~20° C., while the contribution of the zero-wake-up-time algorithm given above to error in electric field measurement is less than 0.15%, and contribution of temperature sensitivity of the sensor (see FIG. 5) is less than 0.35%, resulting in maintaining uncertainty less than 0.5% in measuring electric field (or voltage) as soon as AC voltage is applied to the HV line (zero wake-up time).

It should be noted that the techniques described above may be used for other devices and sensors that have transfer functions of the form substantially given by equations (1) and (2). An example of that is the integrated optics Pockels cell described in the U.S. Pat. No. 5,029,273, issued to Jaeger, and further described in the following paper by Jaeger and Rahmatian: "Integrated Optics Pockels Cell High-Voltage Sensor," IEEE Transactions on Power Delivery, Vol. 10, No. 1, January 1995, pp. 127–134, herein incorporated by reference hereto.

In the explanations above, e.g., on self-temperature-compensating electric field sensor, the concepts of correction and compensation were explained using the amplitude of the AC signal as the parameter of interest. Obviously, the same techniques may be used to characterize and correct for other parameters such as the phase of the AC voltage to be measured, e.g., δ as particularly described in equation (11).

The exposition that follows sets forth an exemplary combination block and flow diagrams illustrating implementation of the aforesaid novel concepts and techniques in accordance with the present invention. As should be appreciated, the description of the blocks and their respective functions may be implemented by a wide variety of analog and digital components, including among others hardware, firm ware, software, and the like including use digital computers, digital processor, i.e., microprocessors, and the like, all of which are intended to be within the true sprit and scope of the present invention.

FIG. 10 is an exemplary combination flow and block diagram for the digital signal processor 920 illustrating particular functions as mathematically described above. As before, digital signal processor 920 receives digital input signals $D_a$ and $D_b$. From these signals, values of K and $\Delta\phi_o$ may be calculated in accordance with equations 6 and 9, as designated by blocks 930 and 932 respectively. In turn these values may be stored as indicated by blocks 940 and 942. Calculation block 950 is operative for calculation of the value E, in accordance with a selected transfer function, for example that described by equation 5. More specifically, calculation block 950 is operative for calculation of the value E, representative of the electric field intended to be measured as a function of the input signals $D_a$ and $D_b$, and the determined values of K and $\Delta\phi_o$ the outputs of blocks 930 and 932, respectively. As indicate, block 950 may receive sensing system specific parameter information, provided as input information, for example $E_\pi$ and α or other such information in order to calculate a particular transfer function, for example equation 5 as illustrated.

It should be noted that in an operative scheme, the value of $\Delta\phi_o$ as calculated by block 932 is a function of K and the values of digital input signals $D_a$ and $D_b$. Accordingly, the value of $\Delta\phi_o$ may be based on a value of K based on a previous samples of $D_a$ and $D_b$, as should be appreciated by those skilled in the art.

Blocks 940 and 942 are intended to be operative for storing values of K and $\Delta\phi_o$ as a function of time thereby permitting a tracking of these parameters, where the value of "t" is the sampling time of digital signals $D_a$ and $D_b$.

As further illustrated in the exemplary combination flow and block diagram of FIG. 10, values of K and $\Delta\phi_o$ may be periodically calculated or updated in accordance with a preselected update time as generally indicated by blocks 960 and 962, for generating a sampling signal as inputs to blocks 940 and 942.

Further illustrated in FIG. 10, is look-up table 987 which contains sensing system specific characterizing information as that already described for correcting and/or compensation the transfer function as desired. More specifically, a table of temp, $\Delta\phi_o$, and 1/R or R may be employed by calculation block 950 in a manner as previously described. The aforesaid look-up table 987 has been intentionally omitted in FIGS. 11 and 12 to enhance understanding of the invention, but which may be incorporated therewith as should be recognized by those killed in the art.

As illustrated in the exemplary combination flow and block diagram of FIG. 11, values of K and $\Delta\phi_o$ may be monitored as indicated by block 970 including comparators for generating an alarm signal input to alarm indicating block 972. For example, the value of K may be monitored and/or tracked to indicate for example the losses in the optical-electrical circuitry are beyond acceptable range or non-existent indicating a fault, or that other catastrophic or performance characteristics as indicated by values of $\Delta\phi_o$ as aforesaid.

As is also indicated in FIG. 11, the value of $\Delta\phi_o$ may be signal processed to provide an output signal indicative of the temperature of the sensing-head as indicated by block 985 which also may be monitored for indicating a system fault in the high voltage environment, or other functions.

Figure 12:
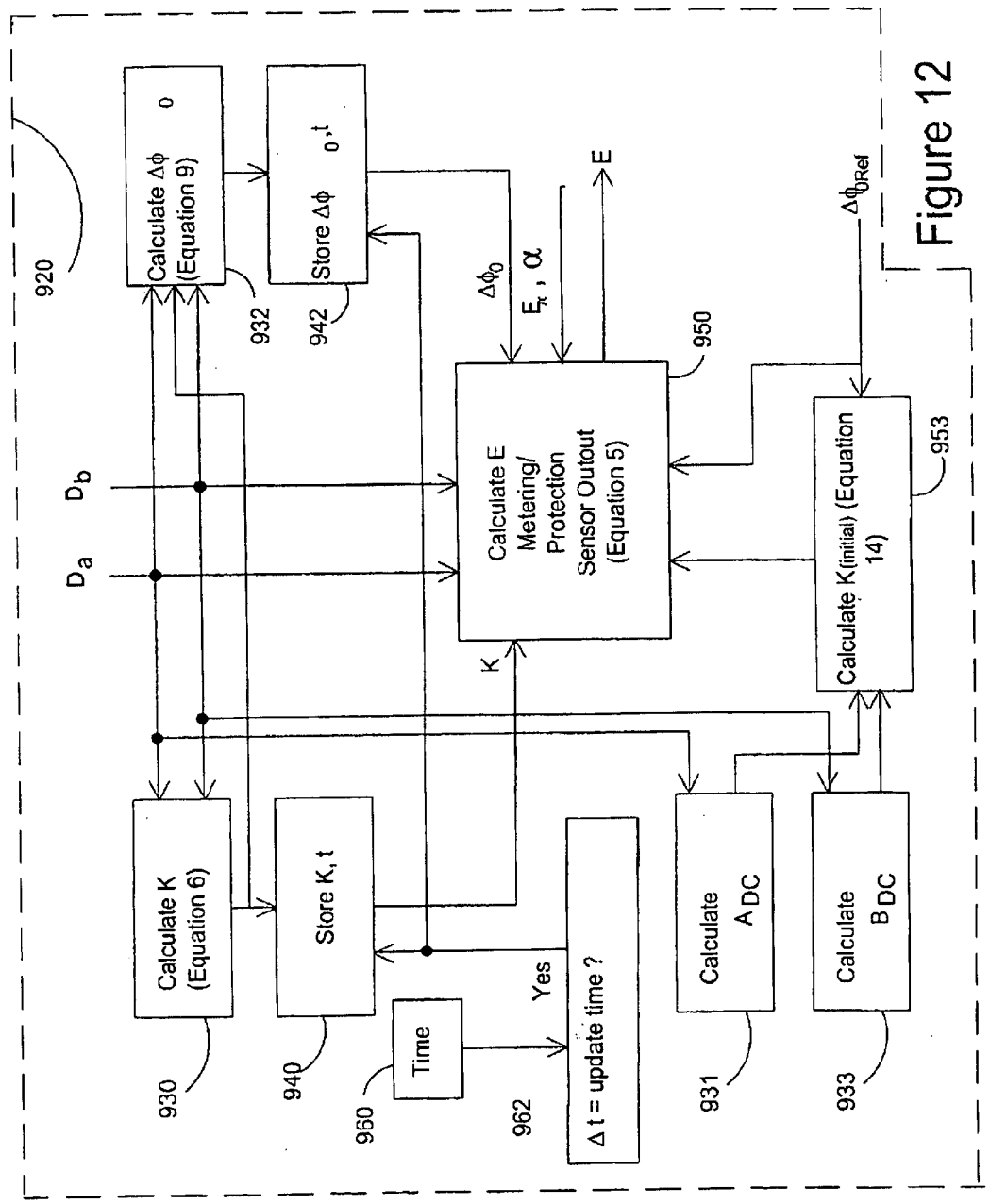
FIG. 12 is another block diagram of an exemplary digital signal processor of that depicted in FIG. 9 arranged for providing a zero wake-up time function.

FIG. 12 illustrates a combination block and flow diagram of a "zero wake-up time" EFS sensing system in accordance with one embodiment of the present invention. Block 931 is illustrated as being responsive to signal $D_a$ for calculating the DC or average value of signal $D_a$, represented by $A_{DC}$; and block 932 is illustrated as being responsive to signal $D_b$ for calculating the DC or average value of signal $D_b$, represented by $B_{DC}$. In turn block 953 serves to calculate an initial vale of the parameter K, namely $K_{initial}$, as a function of an initial reference value of the bias $\Delta\phi_o$ in accordance with equation 14 above.

Thus, in accordance with the many aspects of the present invention shown and described herein, an optical sensing system employing an optical sensor is configured to provide a pair of the light wave components that are signal processed in order to obtain a indication of the measureand, namely an electric field or voltage. These light waves in turn are detected and processed to derive real time characterizing information of the sensing system affected by both optical and electrical anomalies. In specific embodiments, a signal loss factor K, and a residual bias $\Delta\phi_o$, associated with the optical sensor are derived from the two output light waves. In turn, a signal processor serves to evaluate a sensor system transfer function to yield in indication of the desire measureand. Further, the aforesaid parameters, may be tracked, and manipulated to provide other function as described herein, including, temperature indication, system alarm functions, and compensation utilizing look-up tables and the like for correcting sensitivity variations due to temperature, and zero-wake up time function for providing both metering and protection applications.

It should be noted that the input and output optical circuits of the sensing head may be alternatively arranged to achieve the same intended function. For example, quarter-wave plate 26 may alternatively place at the output of the sensor 12 in order to obtain optical output light waves 47 and 49.

It should also be recognized that signal processor 800 including signal conditioning may be constructed from a combination of both digital an analog circuits as desired, all of which are within the true spirit and scope of the present invention.

While the present invention has been particularly shown and described with reference to the accompanying figures, it will be understood, however, that other modifications thereto are of course possible, all of which are intended to be within the true spirit and scope of the present invention. Various changes in form and detail may be made therein without departing from the true spirit and scope of the invention as defined by the appended claims.

Again, it should be noted that other transfer functions may be employed beyond those mathematically expressed by equations 4 and 4a, all of which are intended to be within the true spirit and scope of the present invention as already indicated.

More specifically, it should be recognized by those skilled in the art that the electric field sensing head may take on the form of a wide variety sensor known or to become available that may be selected to achieve the same intended function as described herein, all of which are intended to be within the true spirit and scope of the present invention. Further, the present invention may employ a sensing head intended for sensing a different measureand, but which affects the transit time of light wave components of differing polarization, and is also intended to be within the true spirit and scope of the present invention.

Lastly, specific exemplary mathematical expressions have been set forth herein, however, other such expression are intended to be within the true spirit and scope of the present invention where parameter values related to the values of K and the residual bias are obtained, along with signals indicative of the pair of output light wave from the optical sensing element are processed.

I claim:

1. A self-monitoring electric field sensing system for measuring electric field comprising:

a light source for generating a primary light wave;

first and second photodetectors for providing first and second electrical detector output signals, respectively, in response to any light impinging thereon;

an electric field optical sensing head having;

at least a first optical sensing element that exhibits an electro-optic effect where transit time of light waves passing therethrough of different polarizations are affected differently in response to an electric field thereat;

a first optical circuit responsive to said primary light wave for deriving first and second light wave components therefrom, and coupling said first and second light wave components to said optical sensing element, where said first and second light wave components have different polarizations and having a phase separation, $\phi_o$; and a second optical circuit for deriving third and fourth light waves of different polarization from a light wave exiting from said first sensing element, and directing said third and fourth light waves to impinge upon said first and second photodetectors, respectively; and a signal processor for;

(i) deriving sensing system specific characterization parameters K and $\phi_o$ as a function of a pair of resultant signals a and b, where;

signal a and b are derived from the first and second electrical detector output signals, respectively;

$\phi_o$ is the intrinsic phase shift between the first and second light wave components; and K is equal to the ratio $K_A/K_B$ where $K_A$ and $K_B$ are characteristic loss factors of the specific electric field sensing system, X, associated with said signals a and b; and (ii) deriving an output signal, E, representative of the electric field intended to be measured by a specific electric field sensing system, X, as a sensing system specific characterized function, $G_x$ of;

(a) said first and second electrical detector output signals; and (b) at least said sensing system specific characterization parameters K and $\phi_o$.

2. The self-monitoring electric field sensing system of claim 1 further comprising:

means for selectively comparing at least one said parameters K and $\phi_o$; with a corresponding predetermined reference parameter value, respectively, and providing an output signal indicative of said comparison so as to indicate in-tolerance performance of said self-monitoring electric field sensing system.

3. The self-monitoring electric field sensing system of claim 1 further comprising:

means for providing and output signal indicative of temperature of said sensing element as a function of $\phi_o$.

4. The self-monitoring electric field sensing system of claim 1 wherein said signal processor further includes:

means for determining the average value of said signals a and b;

means for determining an initial value of K as a function of said average values of signals a and b and an estimated value of $\phi_o$;

means for determining subsequent values of K as a function of said signals a and b, and subsequent values of $\phi_o$ derived from a function of said subsequent values of K and said signals a and b; and selectively calculating;

(i) at least one initial value of the electric field in accordance with a selected transfer function being a function of said measured values of signals a and b, initial value of K, and said estimated value of $\phi_o$; and (ii) subsequent values of the electric field in accordance with a selected transfer function being a function of said measured values of signals a and b, said subsequent values of K, and said subsequent values of $\phi_o$.

5. The self-monitoring electric field sensing system of claim 1 wherein:

said first optical circuit is operative such that said first and second light wave components are circularly substantially linearly polarized light wave components of orthongonal opposite polarization and have a phase difference close to 90 degrees; and said second optical circuit serves as a polarizing beam splitter.

6. The apparatus of claim 1 where said sensing system specific characterized function, $G_x$, is mathematically described by:

$$E=G_x\{a, b, E_\pi, \phi_o, K, \alpha\}$$

where, a and b represent resultant signal processor input signals derived from the first and second electrical detector output signals, $E_\pi$ is a sensing system specific parameter being substantially the average electric field required to create a $\pi$ radian phase shift between optical polarization components traveling from the input to the output of said optical sensing element in response to an electric field thereat, $\phi_o$ is the intrinsic phase shift between the first and second light wave components, $\alpha$ is a number between 0 and 1 that characterizes the goodness of the specific electric field sensing system, X, and K is equal to the ratio $K_A/K_B$, where $K_A$ and $K_B$ are characteristic loss factors of the specific electric field sensing system, X, associated with said first and second processor input signals, respectively.

7. A self-monitoring electric field sensing system for measuring an electric field comprising:
- a light source for generating a primary light wave;
- first and second photodetectors for providing first and second electrical detector output signals, respectively, in response to any light impinging thereon, respectively;
- at least a first optical sensing element that exhibits an electro-optic effect where transit time of light waves passing therethrough of different polarizations are affected differently in response to an electric field thereat;
- a first optical circuit responsive to said primary light wave for deriving first and second light wave components therefrom, and coupling said first and second light wave components to said optical sensing element, where said first and second light wave components have different polarizations and having a phase separation, $\phi_o$;
- a second optical circuit for deriving third and fourth light waves of different polarization from a light wave exiting from said first sensing element, and directing said third and fourth light waves to impinge upon said first and second photodetectors, respectively;
- a digital signal processor for deriving a plurality of sensing system specific characterization parameters as a function of a pair of digital resultant signals a and b derived from the first and second electrical detector output signals, respectively; and
- a signal processor for deriving an output signal, E, representative of the electric field intended to be measured by a specific electric field sensing system, X, as a sensing system specific characterized function, $G_x$, of (i) said first and second electrical detector output signals, and (ii) said plurality of sensing system specific characterization parameters.

8. The self-monitoring electric field sensing system of claim 7 wherein said plurality of sensing system specific characterization parameters include:
- an intrinsic phase shift $\phi_o$ between the first and second light wave components, and
- a characteristic loss factor, K, where K is equal to the ratio $K_A/K_B$, where $K_A$ and $K_B$ are characteristic loss factors of the specific electric field sensing system, X, associated with said signals a and b, including any electrical and optical signal losses along the way from said source to said signal proecessor.

9. The self-monitoring electric field sensing system of claim 8 further comprising means for selectively comparing at least one of said characterization parameters K and $\phi_o$ with a corresponding predetermined reference parameter value, respectively, and providing an output signal indicative of said comparison so as to indicate in-tolerance performance of said self-monitoring electric field sensing system.

10. The self-monitoring electric field sensing system of claim 8 further comprising means for providing and output signal indicative of temperature of said sensing element as a function of $\phi_o$.

11. The self-monitoring electric field sensing system of claim 8 wherein said signal processor further includes:
- means for determining the average value of each of said signals a and b;
- means for determining an initial value of K as a function of said average values of signals a and b, and an initial estimated value of $\phi_o$;
- means for determining subsequent values of K as a function of said signals a and b, and subsequent values of $\phi_o$ derived as a function of said subsequent values of K and said signals a and b; and
- selectively calculating;
  - (i) at least one initial value of the electric field in accordance with a selected transfer function being as a function of said initial value of K, and said initial estimated value of $\phi_o$; and
  - (ii) subsequent values of the electric field in accordance with a selected transfer function being a function of said subsequent values of K and said subsequent values of $\phi_o$.

12. The self-monitoring electric field sensing system of claim 7 wherein:
- said first optical circuit is operative such that said first and second light wave components are substantially linearly polarized light wave components of opposite polarization having a phase difference close to 90 degrees; and
- said second optical circuit serves as a polarizing beam splitter.

13. A self monitoring method for measuring an electric field with an optical electric field sensing element where said electric field sensing element that exhibits an electro-optic effect where the transit time of light waves passing therethrough of different polarizations are affected differently in response to an electric field thereat, and includes an input means for receiving light waves, and a light output means from which light waves exit therefrom, the method comprising the steps of:
- generating a primary light wave;
- deriving, by way of a first optical circuit, first and second light wave components, of different polarizations from said primary light wave thereof, and coupling said first and second light wave components to said input means of said sensing element;
- deriving, by way of a second optical circuit, third and fourth light waves of different polarization from a light wave exiting from said sensing element output means;
- generating first and second electrical detector output signals in response to said third and fourth light waves impinging upon first and second photodetectors, respectively;
- deriving a plurality of sensing system specific characterization parameters as a function of a pair of digital resultant signals a and b derived from the first and second electrical detector output signals, respectively; and
- deriving an output signal, E, representative of the electric field intended to be measured by a specific electric field sensing system, X, as a sensing system specific characterized function, $G_x$, of said first and second electrical detector output signals, where said sensing system specific characterized function, $G_x$, is a function of said plurality of sensing system specific characterization parameters.

14. The method of claim 13 where said sensing system specific characterized function, $G_x$, is mathematically described by:

$$E = G_x\{a, b, E_x, \phi_o, K, \alpha\}$$

where,
- a and b represent resultant signal processor input signals derived from the first and second electrical detector output signals, $E_\pi$ is a sensing system specific parameter being substantially the average electric field required to create a $\pi$ radian phase shift between optical polarization components traveling from the input to the output of said optical sensing element in response to an electric field thereat, $\phi_o$ is the intrinsic phase shift between the first and second light wave components, $\alpha$ is a number between 0 and 1 that characterizes the goodness of the specific electric field sensing system, X, and K is equal to the ratio $K_A/K_B$, where $K_A$ and $K_B$ are characteristic loss factors of the specific electric field sensing system, X, associated with said first and second processor input signals, respectively.

15. The method and apparatus of electric field sensing system of claim 13 wherein:

said first optical circuit is operative such that said first and second light wave components are linearly polarized light wave components of polarization; and said second optical circuit serves as a polarizing beam splitter.

16. A self-monitoring method for measuring an electric or magnetic field with an optical sensing element where said sensing element includes an input means for receiving light waves, and a light output means from which light waves exit therefrom, the method comprising the steps of:

generating a primary light wave;

deriving, by way of a first optical circuit, first and second light wave components, of different polarizations from said primary light wave thereof, and coupling said first and second light wave components to said input means of said sensing element;

deriving, by way of a second optical circuit, third and fourth light waves of different polarization from a light wave exiting from said sensing element output means;

generating first and second electrical detector output signals in response to said third and fourth light waves impinging upon first and second photodetectors, respectively;

deriving a plurality of sensing system specific characterization parameters as a function of a pair of digital resultant signals a and b derived from the first and second electrical detector output signals, respectively; and deriving an output signal, E, representative of the electric or magnetic field intended to be measured by a specific sensing system, X, as a sensing system specific characterized function, $G_x$, of said first and second electrical detector output signals, where said sensing system specific characterized function, $G_x$ is a function of said plurality of sensing system specific characterization parameters.

17. The method of claim 16 where said sensing system specific characterized function, $G_x$, is mathematically described by:

$$E = G_x\{a, b, E_\pi, \phi_o, K, \alpha\}$$

where, a and b represent resultant signal processor input signals derived from the first and second electrical detector output signals, $E_\pi$ is a sensing system specific parameter being substantially the average electric or magnetic field required to create a $\pi$ radian phase shift between optical polarization components traveling from the input to the output of said optical sensing element in response to an electric or magnetic field thereat, $\phi_o$ is the intrinsic phase shift between the first and second light wave components, $\alpha$ is a number between 0 and 1 that characterizes the goodness of the specific electric or magnetic field sensing system, X, and K is equal to the ratio $K_A/K_B$, where $K_A$ and $K_B$ are characteristic loss factors of the specific electric field sensing system, X, associated with said first and second processor input signals, respectively.

18. The method of claim 17 further comprising: the step of selectively comparing at least one said parameters K and $\phi_o$ with a corresponding predetermined reference parameter value, respectively, and providing an output signal indicative of said comparison so as to indicate in-tolerance performance.

19. The method of claim 17 further comprising the steps of providing an output signal indicative of temperature of said sensing element as a function of $\phi_o$.

20. The method of claim 16 wherein:

said first optical circuit is operative such that said first and second light wave components are linearly polarized light wave components of opposite polarization; and said second optical circuit serves as a polarizing beam splitter.

21. The method of claim 16 wherein:

said first optical circuit is operative such that said first and second light wave components are circularly polarized light wave components of opposite polarization; and said second optical circuit serves as a polarizing beam splitter.

22. A self-monitoring optical sensing system for sensing a selected measureand comprising:

a light source for generating a primary light wave;

first and second photodetectors for providing first and second electrical detector output signals, respectively, in response to any light impinging thereon;

an optical sensing head adapted to receive a pair of first and second light wave components derived form said primary light wave, where said first and second light wave components have different polarizations, and said first and second light wave components are affected differently in response to the measureand;

an output optical circuit for deriving third and fourth light waves of different polarization from light wave components exiting from said optical sensing head, and directing said third and fourth light waves to impinge upon said first and second photodetectors, respectively; and a signal processor for;

deriving sensing system specific characterization parameters K and $\phi_o$ as a function of a pair of resultant signals a and b; where, signals a and b are derived from the first and second electrical detector output signals, respectively;

$\phi_o$ is the intrinsic phase shift between the first and second light wave components; and K is equal to the ratio $K_A/K_B$, where $K_A$ and $K_B$ are characteristic loss factors of the specific measureand optical sensing system, X, associated with said signals a and b; and deriving an output signal, E, representative of the measureand intended to be measured by the specific optical sensing system, X, as a sensing system specific characterized function, $G_x$, of;
(a) said first and second electrical detector output signals; and
(b) said plurality of sensing system specific characterization parameters.

23. The apparatus of claim 22 where said sensing system specific characterized function, $G_x$, is mathematically described by:

$$E = G_x\{a, b, E_\pi, \phi_o, K, \alpha\}$$

where,
a and b represent resultant signal processor input signals derived from the first and second electrical detector output signals,
$E_\pi$ is a sensing system specific parameter being substantially the average measureand required to create a $\pi$ radian phase shift between optical polarization components traveling from the input to the output of said optical sensing head in response to the measureand thereat,
$\phi_o$ is the intrinsic phase shift between the first and second light wave components,
$\alpha$ is a number between 0 and 1 that characterizes the goodness of the specific optical sensing system, X, and
K is equal to the ratio $K_A/K_B$, where $K_A$ and $K_B$ are characteristic loss factors of the specific optical sensing system, X, associated with said first and second processor input signals, respectively.

24. A self monitoring method for measuring a measureand by an optical sensing system where an optical sensing head exhibits an effect where light waves of different polarizations passing therethrough are affected differently in response to the measureand thereat, and where the sensing head includes an input means for receiving light waves, and a light output means from which light waves exit therefrom, the method comprising the steps of:
generating a primary light wave;
deriving, by way of a first optical circuit, first and second light wave components, of different polarizations, from said primary light wave, and coupling said first and second light wave components to said input means of said optical sensing head;
deriving, by way of a second optical circuit, third and fourth light waves of different polarization from a light wave exiting from said output means of said optical sensing head;
generating first and second electrical detector output signals in response to said third and fourth light waves impinging upon first and second photodetectors, respectively;
deriving a plurality of sensing system specific characterization parameters as a function of a pair of digital resultant signals a and b derived from the first and second electrical detector output signals, respectively; and
deriving an output signal, E, representative of the measureand intended to be measured by a specific optical sensing system, X, as a sensing system specific characterized function, $G_x$, of said first and second electrical detector output signals, where said sensing system specific characterized function, $G_x$, is a function of said plurality of sensing system specific characterization parameters.

25. The method of claim 24 where said sensing system specific characterized function, $G_x$, is mathematically described by:

$$E = G_x\{a, b, E_\pi, \phi_o, K, \alpha\}$$

where,
a and b represent resultant signal processor input signals derived from the first and second electrical detector output signals,
$E_\pi$ is a sensing system specific parameter being substantially the average measureand required to create a $\pi$ radian phase shift between optical polarization components traveling from the input to the output of said optical sensing element in response to an electric field thereat,
$\phi_o$ is the intrinsic phase shift between the first and second light wave components,
$\alpha$ is a number between 0 and 1 that characterizes the goodness of the specific optical sensing system, X, and
K is equal to the ratio $K_A/K_B$, where $K_A$ and $K_B$ are characteristic loss factors of the specific optical sensing system, X, associated with said first and second processor input signals, respectively.

26. The method of claim 25 further comprising the step of selectively comparing at least one of said characterization parameters K and $\phi_o$ with a corresponding predetermined reference parameter value, respectively, and providing an output signal indicative of said comparison so as to indicate in-tolerance performance of said self-monitoring electric field sensing system.

27. The method of claim 25 further comprising the step of providing an output signal indicative of temperature of said sensing element as a function of $\phi_o$.

28. The method of claim 24 wherein said plurality of sensing system specific characterization parameters include:
an intrinsic phase shift $\phi_o$ between the first and second light wave components, and
a characteristic loss factor, K, where K is equal to the ratio $K_A/K_B$, where $K_A$ and $K_B$ are characteristic loss factors of the specific electric field sensing-system, X, associated with said signals a and b, including any electrical and optical signal losses along the way from said source to said signal processor.

29. The method of claim 24 further includes the steps of:
determining the average value of each of said signals a and b;
determining an initial value of K as a function of (i) said average values of signals a and b, and (ii) an initial estimated value of $\phi_o$;
determining subsequent values of K as a function of said signals a and b, and subsequent values of $\phi_o$ derived as a function of said subsequent values of K and said signals a and b; and
selectively calculating;
(i) at least one initial value of the measureand in accordance with a selected transfer function being a function of said initial value of K, and said initial estimated value of $\phi_o$; and
(ii) subsequent values of the measureand in accordance with a selected transfer function being function of said subsequent values of K and said subsequent values of $\phi_o$.

* * * * *